United States Patent [19]

Washburn

[11] 4,184,068
[45] Jan. 15, 1980

[54] FULL BINARY PROGRAMMED FREQUENCY DIVIDER

[75] Inventor: Clyde Washburn, Fairport, N.Y.

[73] Assignee: Harris Corporation, Cleveland, Ohio

[21] Appl. No.: 851,365

[22] Filed: Nov. 14, 1977

[51] Int. Cl.² .............................................. H03K 21/36
[52] U.S. Cl. ............................ 235/92 CC; 235/92 PE; 235/92 DM; 328/46; 328/48
[58] Field of Search ................ 328/46, 48; 235/92 CC, 235/92 DM, 92 PE, 92 PL

[56] References Cited

U.S. PATENT DOCUMENTS

| 3,230,352 | 1/1966 | Grondin et al. | 235/92 DM |
| 3,863,224 | 1/1975 | Alexander | 235/92 PE |
| 4,053,739 | 10/1977 | Miller et al. | 235/92 PE |
| 4,084,082 | 4/1978 | Alfke | 235/92 CC |

Primary Examiner—Joseph M. Thesz

[57] ABSTRACT

A programmable frequency divider including a conventional dual modulus prescaler where neither modulus is a power of two. An adapter circuit is included for forcing the prescaler to follow a selected one of two preselected sequences of moduli. These sequences are selected so that a modified prescaler results having modified moduli, one of which is a power of two. The modified prescaler is used in a fully programmable frequency divider circuit. Since one of the modified moduli is a power of two, the frequency divider circuit may be programmed in full binary.

7 Claims, 4 Drawing Figures

FULL BINARY PROGRAMMED FREQUENCY DIVIDER

BACKGROUND AND FIELD OF THE INVENTION

The present invention relates to a programmable frequency divider, and more particularly to a full binary programmed frequency divider which uses a dual modulus prescaler, where neither modulus of the prescaler is a power of 2.

A programmable frequency divider is a circuit which divides down an input signal to provide an output pulse train where the repetition frequency of the output pulse train is a selected fraction of the frequency of the input signal. The repetition frequency of the output pulse train can be varied by changing the division ratio which is set into the frequency divider.

Frequency dividers of this type are commonly employed in frequency control of frequency synthesizers. With the application of frequency synthesis techniques to high frequency communications applications, a need has arisen for a high speed, fully programmable frequency divider. Available dividers which are fully programmable, however, do not meet speed requirements, whereas those dividers that are fast enough lack programming capacity.

The lack of availability of frequency dividers having the required characteristics has led to the development of "pulse swallowing" dividers. Programmable frequency dividers of this general type are described in the article entitled "Making Programmable UHF Counters When None Are Available Or . . . Pulse Swallowing Revisited"; this article appeared in volume 3, No. 4 of the *Fairchild Journal of Semiconductor Progress*. These dividers combine dividers that are very fast, but which lack programming capacity, with dividers that are fully programmable, but rather slow, to produce a resulting divider which appears to be very fast, but yet is fully programmable. The "fast" dividers used in these techniques are conventional dual modulus prescalers which divide the input signal by a selected one of two moduli. Off-the-shelf prescalers have moduli of 10 and 11, and 5 and 6, with the (divide by 10/11) prescaler being most commonly used.

Programmable pulse swallowing dividers are conventionally constructed to accept binary-coded-decimal (BCD) programming signals. This leads to somewhat awkward programming, and inefficient use of the programming lines. A more efficient use could be made of the programming lines and capabilities of the system if a pulse swallowing divider could be implemented employing full binary programming.

SUMMARY OF THE INVENTION

There is disclosed herein a fully programmable frequency divider which employs conventional dual modulus prescalers where neither modulus of the prescaler is a power of 2. Although conventionally this would result in a frequency divider which is not programmable in full binary, a system is disclosed which implements a full binary programmable divider therefrom. This results in a minimization of the programming word length, coupled with a very efficient use of programming capacity.

There is described herein a frequency divider which is responsive to an input signal for dividing that signal by a selected factor to provide an output signal comprised of a periodic train of pulses whose repetition frequency is a selected fraction of the frequency of the input signal. This system includes a variable modulus prescaler which is responsive to the input signal to provide a prescaler output pulse train whose repetition frequency is 1/Mth that of the input signal, where M is the modulus of the prescaler. The prescaler has a variable modulus so that M may comprise any one of at least two selectable values. A swallow counter is provided for counting the pulses of the prescaler output pulse train and for controlling the modulus M of the prescaler so that the modulus has one value until the count reaches a selected value N1, and has a second value thereafter until the count is reset. A program counter also counts the pulses of the prescaler output pulse train and provides an output pulse whenever the count reaches a selected value N2 with each of the output pulses being operative to reset the swallow counter and program counter. The output pulses together form the output signal of the frequency divider. Means are also provided for selecting the values of N1 and N2 so as to thereby select the factor by which the input signal is divided.

In accordance with the present invention, the variable modulus prescaler which is included in this system comprises a conventional variable modulus prescaler which has at least two moduli neither of which is a power of 2. Adaptor means are included for modifying the moduli of the variable modulus prescaler so that at least one of the modified moduli is a power of 2, whereby the selected values N1 and N2 may be programmed in full binary so as to minimize the number of programming lines required.

BRIEF DESCRIPTION OF THE DRAWINGS

The foregoing and other objects and advantages of the present invention will become more readily apparent from the following description of a preferred embodiment, as taken in conjunction with the accompanying drawings which are a part hereof and wherein.

DETAILED DESCRIPTION

Figure 1:
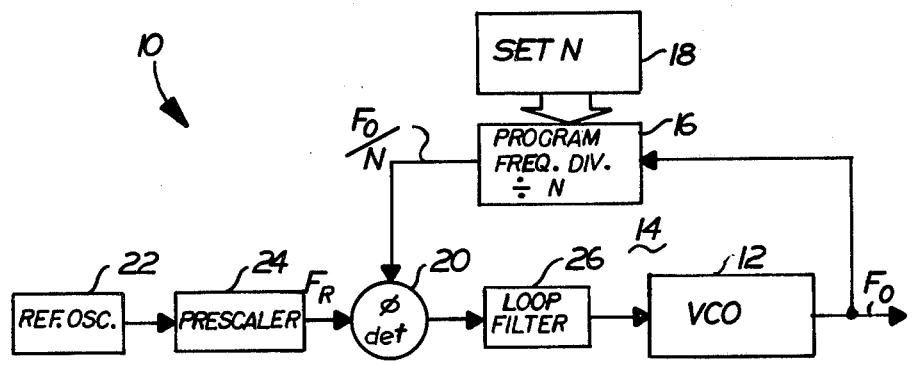
FIG. 1 is a general block diagram of a frequency synthesizer in which the programmable frequency divider of the present invention could conveniently find use.

There is illustrated in FIG. 1 a frequency synthesizer of conventional construction in which the programmable frequency divider disclosed herein could conveniently find use. It will be appreciated, however, that the programmable frequency divider described herein could as easily be used in any of the applications in which frequency dividers are currently employed. The following description of the frequency synthesizer is included solely for exemplary purposes and is in no way intended to limit the scope of the invention.

In FIG. 1 there is illustrated a frequency synthesizer 10 for generating a selected frequency along an output line thereof. This frequency synthesizer includes a voltage control oscillator VCO (12) which provides an oscillating signal $F_o$ at the output VO thereof and which is responsive to an analog signal at its input VI to control the frequency of the output signal. A feedback loop 14 is provided to adjust the frequency control signal which is supplied to VCO 12. This feedback loop includes a programmable frequency divider 16 which divides the input frequency derived from VCO 12 by an integer N set into the programmable frequency divider by a circuit 18. Frequency select circuit 18 may merely be manually operable thumbwheel switches, or it may be a more elaborate scheme of frequency control. The output supplied by the programmable frequency divider 16 will therefore have a repetition frequency which is equal to $F_o/N$. This divided down signal is supplied to a phase detector 20 where it is compared with a stable reference frequency $F_r$. A crystal oscillator 22 oscillates at a high multiple of the reference frequency $F_r$, with a fixed divider circuit 24 being provided to divide down this signal to provide the reference frequency $F_r$.

The output signal supplied by phase detector 20 will comprise an analog signal having an amplitude which will vary with the phase difference between the reference frequency $F_r$ and the output ($F_o/N$) of programmable frequency divider 16. This analog signal will be filtered by loop filter 26 to provide the analog frequency control signal for VCO 12. The frequency control loop will then operate in a well known manner to phase lock the operation of VCO 12 at the frequency where $F_o = NF_r$.

Figure 2:
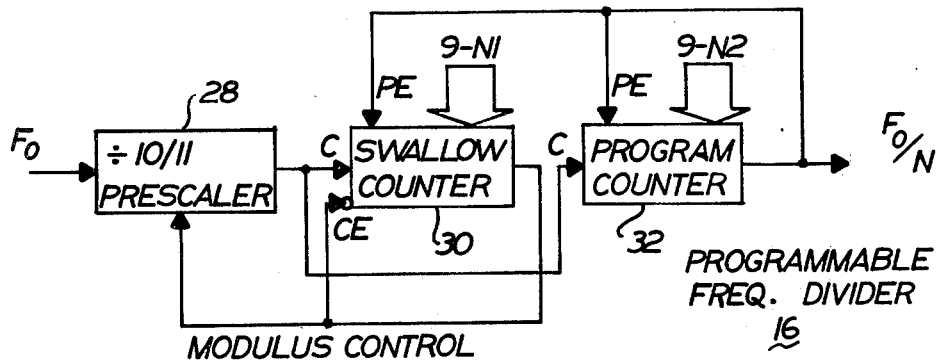
FIG. 2 is a general block diagram of a prior art programmable frequency divider.

There is illustrated in FIG. 2 a prior art programmable frequency divider. This programmable frequency divider combines a very fast, dual modulus prescaler 28 with two fully programmable, but rather slow, counters 30 and 32 to provide the appearance of a very fast, fully programmable divider. Prescaler 28 is essentially a divider which divides the input frequency $F_o$ by one of two factors, depending upon the level of a modulus control signal. The device will divide by 10 when the modulus control input is at a high logic level and by 11 when the input is at a low logic level. The output pulses provided by this prescaler are directed to the count input C of a fully programmable BCD counter, identified as swallow counter 30 in FIG. 2, which is provided for controlling the modulus of prescaler 28. Swallow counter 30 has an output which will remain at a low logic level until the counter has reached a given maximum count, at which point the output will shift to a high logic level. The output is directed back to a count enable input CE to the swallow counter 30, and will disable swallow counter 30 from overflowing upon reaching the maximum count. In addition, this output is directed to the modulus control input of prescaler 28.

At the beginning of each cycle of frequency divider 16, swallow counter 30 will be preset with a selected number (9−N1) and will proceed to count up from this number. The number N1 of clock pulses which will be required in order for swallow counter 30 to reach its maximum count (9) will therefore depend upon the value of this preset number. Until swallow counter 30 reaches this maximum value, the modulus control output thereof will be at a low logic level so that prescaler 28 will divide the input signal by a factor of 11. After reaching the maximum count, the modulus control signal will shift to a high logic level which will cause prescaler 28 to thereafter divide the input signal by a factor of 10.

The total number of prescaler output pulses which will occur in each cycle of frequency divider 16 will be determined by a fully programmable, BCD program counter 32. As with swallow counter 30, program counter 32 includes an output which remains at a low logic level until a maximum count has been reached thereby. Also as with swallow counter 30, program counter 32 is loaded at the beginning of each cycle with a preset number (9−N2) which will determine the number N2 of pulses required for program counter 32 to reach the maximum count (9). The output of program counter 32 is directed to the preset inputs PE of both swallow counter 30 and program counter 32. Thus, when program counter 32 reaches its maximum count, the shift of the output thereof to a high logic level will cause both swallow counter 30 and program counter 32 to be preset, thereby initiating the next cycle.

The total divider ratio of the programmable frequency divider of FIG. 2 will be:

$$N = (11)N1 + (10)(N2 - N1) \tag{1}$$

$$= (11 - 10)N1 + (10)N2 \tag{2}$$

$$= N1 + (10)N2 \tag{3}$$

This defines a BCD programming scheme; N1 and N2 may take on values (0–9). The program counter could, of course, include several decade counters to increase the range of the divider. Also, the program counter could in fact be binary rather than BCD, but this would lead to extremely awkward programming of the divider.

Expressed in more general terms, the divider ratio of the programmable frequency divider of FIG. 2 may be expressed as:

$$N = (G - H)N1 + (H)N2 \tag{4}$$

where G, H are the two moduli of the prescaler.

It is clear from this the binary programming of all bits of the counters may only be accomplished if H is a power of 2. Unfortunately, the commonly available prescalers have divider ratios of divide-by-10/11 and divide-by-5/6: none of these moduli is a power of 2.

In accordance with the present invention, a circuit is provided for implementing a full binary programmed frequency divider wherein a conventional dual modulus prescaler is utilized in which neither of the moduli of the prescaler is a power of 2.

Figure 3:
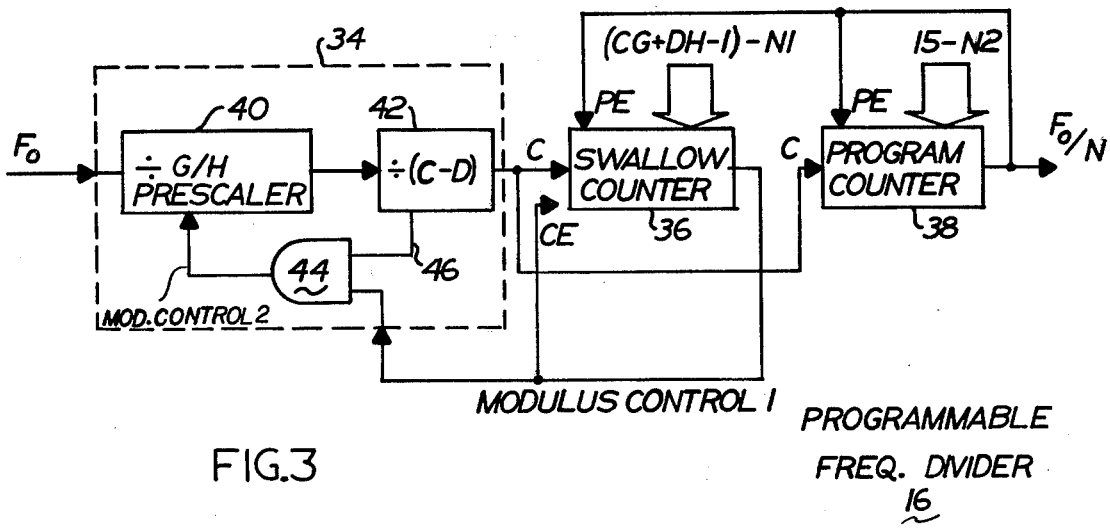
FIG. 3 is a general block diagram of a programmable frequency divider in accordance with the teachings of the present invention; and, FIG. 4 is a more detailed schematic diagram of a portion of the modified prescaler of FIG. 3.

One embodiment of a programmable frequency divider in accordance with the teachings of the present invention is illustrated in FIG. 3. This programmable frequency divider includes a dual modulus prescaler 34, a swallow counter 36, and a program counter 38. Counters 36 and 38 perform functions which are similar to those performed in the divider of FIG. 2. Prescaler 34 has, however, been modified so as to include a modulus which is a power of 2. Modified prescaler 34 includes a conventional prescaler 40 and an adapter circuit comprised of a divider circuit 42 and an AND gate 44. The only constraints on prescaler 40 are:

$$CG + DH = 2^E \tag{5}$$

and $$|G - H| = 2^F \tag{6}$$

where C, D, E, and F are integers and $E > F$. Equation 5 may be interpreted as requiring that some sequence of moduli of the conventional prescaler 40 result in a division ratio which is a power of two. It will be noted that a conventional (divide by 10/11) prescaler does meet these constraints when C=2 and D=1; thus:

$$(2)(11)+(1)(10)=32=2^5 \qquad (7)$$

and $$|11-10|=1=2^0 \qquad (8)$$

Therefore, by constraining prescaler 40 to follow a selected sequence of moduli, a prescaler may be implemented which includes a modulus which is a power of 2. This is the function of the adapter circuit.

Divider circuit 42 responds to the output of prescaler 40 and is included to implement equation 5. Divider circuit 42 has an output 46 which is directed to AND gate 44 for controlling the modulus of prescaler 40. This output will be low for C output pulses of prescaler 40, and will be high for the next D pulses thereafter. When the output 46 of divider 42 is at a low level, the output of AND gate 44 will similarly be at a low level so that prescaler 40 will have a modulus of G. When output 46 of divider 42 is at a high level, however, AND gate 44 will be enabled and will respond to the modulus control output of swallow counter 46. The net effect will be to provide the appearance of a prescaler having divider ratios of (CG+DH) and (C+D)G, depending on the level of the modulus control output swallow counter 36. A prescaler has thus been implemented where one of its moduli, (CG+DH), is a power of 2.

Expressed in more general terms, the two moduli of the modified prescaler are:

$$M1 = CG+DH \qquad (9)$$

$$M2 = (C+X)G+(D-X)H \qquad (10)$$

where M1, M2 are the two moduli of the modified prescaler, and x is the number of steps in the sequence which are changed when switching from one modulus to the next. It will be noted that the circuitry of FIG. 3 constrains X to be equal to D (assuming the output of the swallow counter remains fixed during the sequence), so that $M2=(C+D)G$. This does not represent a general limitation, however. Generally, X will be selected to be as low as possible so as to provide maximum divider resolution. Thus, the alternate modulus will generally be:

$$M2 = (C+1)G+(D-1)H \qquad (11)$$

or $$M2 = (C-1)G+(D+1)H \qquad (12)$$

Equations (10) and (11) characterize the situation where only one step in the sequence is modified from one modulus to the next.

Figure 4:
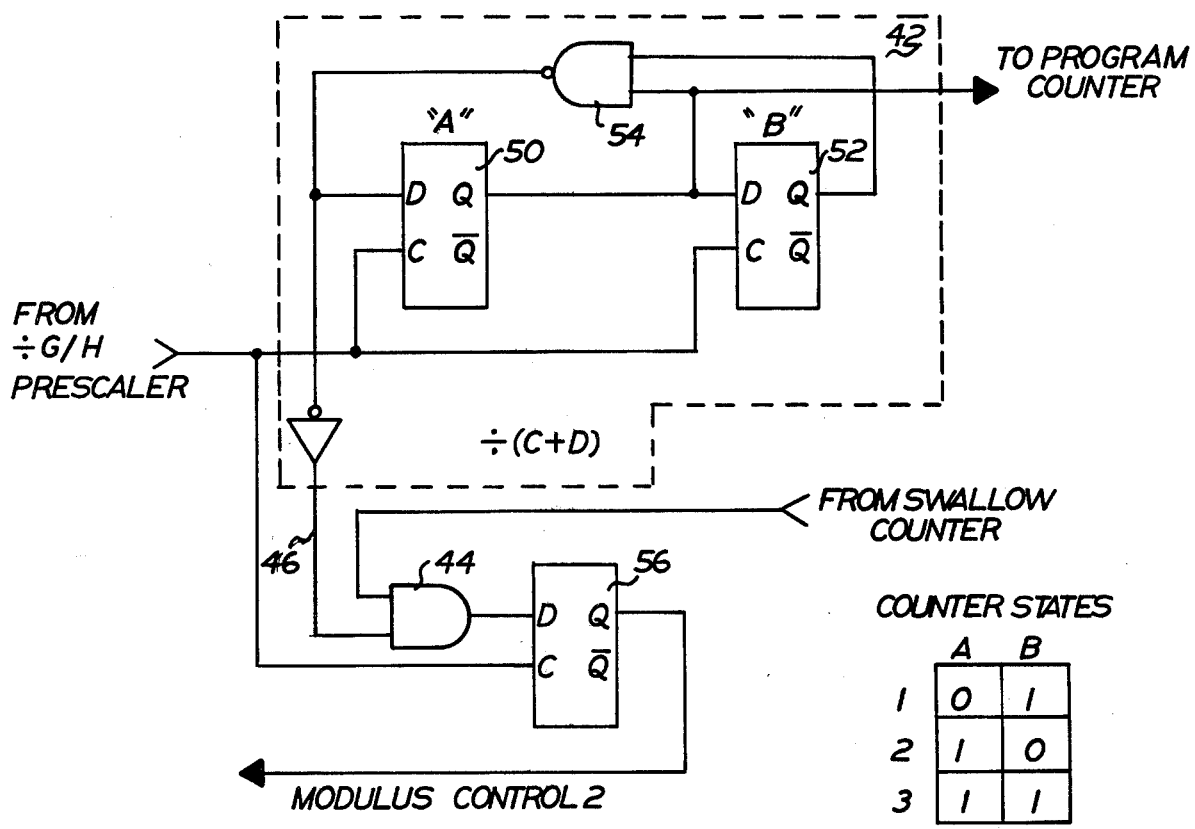

A more detailed illustration of a specific adapter circuit for use with a divide-by-10/11 prescaler is illustrated in FIG. 4. In this Figure it will be seen that divider circuit 42 comprises two, parallel-clocked type "D" flip flops 50 and 52. Flip flop 50 and 52 are constrained to operate in a divide by 3 sequence by AND gate 54. The counter states resulting from this configuration are listed in the lower right hand portion of FIG. 4. With successive clock pulses, the counter will proceed from state 1 to 2 and then 3. With the next clock pulse, the counter will return to state 1. Since clock pulses are being continuously provided, the counter will continuously cycle through the three counter states. The output 46 of divider circuit 42 is provided by ANDing together the Q outputs of flip flops 50 and 52. The output of AND gate 54 will be low for 2 clock pulses (through counter states 1 and 2), and high for the next succeeding one clock pulse (state 3). Thus, for this circuit C=2 and D=1. Also, since AND gate 44 will only be enabled for one clock pulse, only one step in the sequence will be altered when switching from one modulus to the other. Thus, for this circuit, X=1.

Unlike the circuitry of FIG. 3, the output of AND gate 44 is not directly connected to the modulus control input to prescaler 40. Rather, a flip flop 56 is provided for synchronizing the output of AND gate 44 with the clocking of prescaler 40. The output of flip flop 56 will reflect the output of AND gate 44, but will only change states upon the occurence of a clock pulse from prescaler 40.

The net operation of the circuitry illustrated in FIG. 4 will be to force prescaler 40 to operate in a divide by 11, 11, 10 sequence, or a divide by 11, 11, 11 sequence, depending upon the output of swallow counter 36. The circuit therefore provides the appearance of a divide-by-32/33 prescaler. When the modification illustrated in FIG. 4 is utilized in the divider of FIG. 3, the overall divider ratio may be defined as:

$$N = N1 + (32)N2 \qquad (13)$$

This follows from equation 4. Full binary programming may therefore be realized by making swallow counter 36 a 5 bit binary counter (so that N1 may take on values from 0-31), and making program counter 38 a binary counter having any desired number of stages. The divider will therefore be programmed in full binary so that the net result is to minimize the number of control lines necessary for programming the frequency divider.

Although the invention has been described with respect to a preferred embodiment, it will be appreciated that various rearrangements and alterations of parts may be made without departing from the spirit and scope of the present invention, as defined in the appended claims.

What is claimed is:

1. A dual modulus prescaler having two selectable moduli, one of which is a power of two, comprising:
   a high speed, non-binary prescaler adapted to respond to an input signal for providing a divider output signal whose frequency is 1/Mth the frequency of said input signal, M being the modulus of said non-binary prescaler, wherein M is selected to be one of two values G and H by a modulus control signal, neither value being a power of two but where (CG+DH) is a power of two, C and D being integers, and
   adapter means for providing said modulus control signal for controlling the modulus M of said non-binary prescaler to force said non-binary prescaler to operate in a selected one of two sequences of moduli, one of said sequences being defined by the expression (CG+DH), and for providing an output pulse for each said sequence, whereby a dual modulus prescaler is provided having two selectable moduli, one of which is a power of two.

2. A dual modulus prescaler as set forth in claim 1, wherein said adapter means comprises counter means for counting cycles of said divider output signal and for providing a modulus control signal in accordance with said count.

3. A dual modulus prescaler as set forth in claim 2, wherein said counter means includes means for providing a first modulus control signal for C cycles of said divider output and a second modulus control signal for the next D cycles of said divider output, with said first modulus control signal selecting said modulus G and said second modulus control signal selecting said modulus H.

4. A dual modulus prescaler as set forth in claim 3, wherein said counter means further includes means for selecting the modulus of said dual modulus prescaler including means for selectively changing or not changing said second modulus control signal into said first modulus control signal whereby said two sequences of moduli are defined by the expressions (CG+DH) and (C+X)G+(D−X)H, respectively, where X is the number of steps in the sequence which are changed when switching from one modulus to the other.

5. A frequency divider responsive to an input signal for dividing said signal by a selected factor to provide an output signal comprised of a periodic train of pulses whose repetition frequency is a selected fraction of the frequency of said input signal, comprising:
variable modulus prescaler means responsive to said input signal for providing a prescaler output pulse train whose repetition frequency is 1/Pth that of said input signal, P being the modulus of said prescaler means, wherein P may be selected to be either of at least two values;
swallow counter means for counting the pulses of said prescaler output pulse train and for controlling the modulus P of said prescaler means so that said modulus has a first value until said count reaches a selected count N1, and has a second value thereafter, until said swallow counter means is reset;
program counter means for counting the pulses of said prescaler output pulse train and for providing an output pulse when said count reaches a selected value N2, each of said output pulses being operative to reset said swallow counter means and said program counter means, said output pulses forming said output signal; and
frequency selection means for selecting said selected values N1 and N2 so as to thereby select said factor by which said input signal is divided,
wherein said variable modulus prescaler means comprises second prescaler means responsive to said input signal to provide a second prescaler output whose frequency is 1/Mth that of said input signal, M being the modulus of said second prescaler means, wherein M may be selected to be either of at least two values, neither of which is a power of two, and adapter means for controlling the operation of said second prescaler to force said second prescaler to operate in a selected one of two sequences and for providing a pulse of said prescaler output pulse train for each sequence whereby said variable modulus prescaler means provides a prescaler output pulse train whose repetition frequency is 1/Pth that of said input signal, P being the effective modulus of said prescaler means, and wherein P may be selected to be either of at least two values by selecting a corresponding one of said sequences, said sequences being selected so that at least one value of P is a power of two, thereby allowing full binary programming of said swallow counter means and said program counter means.

6. Apparatus as set forth in claim 5, wherein said second prescaler means has two moduli G and H, neither of which is a power of two, but where (CG+DH) is a power of two, C and D being integers, said adapter means including means for forcing said second prescaler means to operate in a selected one of two sequences, where one of said sequences is defined by the expression (CG+DH), said sequence including C cycles of said second prescaler means in said G modulus and D cycles in said H modulus.

7. Frequency divider apparatus comprising:
a binary prescaler including a non-binary, high speed, dual modulus prescaler adapted to respond to an input signal for counting cycles of said input signal and providing prescaler output pulses each N of said cycles, where N is the modulus of said non-binary prescaler, and wherein said modulus of said non-binary prescaler is selectable to be either one of two values, neither of which is the power of two, and adapter means responsive to said prescaler output pulses for controlling said selectable modulus of said non-binary prescaler so that said non-binary prescaler is caused to follow a selected one of two sequences of moduli and for providing a divider output pulse at the conclusion of each said sequence such that said adapter provides binary prescaler output pulses every M of said cycles of said input signal, where M is the modulus of said binary prescaler and is selectable to be one of two values by selecting which of said two sequences of moduli is followed by said non-binary prescaler, said sequences being selected so that one of said moduli of said binary prescaler is a power of two; and,
means controllable to cause said binary prescaler to cyclically repeat one of said two sequences of moduli a selected first number of times and the other of said two sequences of moduli a selected second number of times, whereby said first and second numbers may be full binary numbers since one of said moduli of said binary prescaler is a power of two.

* * * * *